United States Patent [19]
Nomura et al.

[11] Patent Number: 5,471,060
[45] Date of Patent: Nov. 28, 1995

[54] PYROELECTRIC INFRARED RADIATION DETECTOR AND METHOD OF PRODUCING THE SAME

[75] Inventors: Koji Nomura; Tutomu Nakanishi; Tokumi Kotani, all of Osaka; Keizaburo Kuramasu, Tsuzuki, all of Japan

[73] Assignee: Matsushita Electric Industrial Co., Ltd., Osaka, Japan

[21] Appl. No.: 220,450

[22] Filed: Mar. 30, 1994

[30] Foreign Application Priority Data

| | | | |
|---|---|---|---|
| Aug. 23, 1993 | [JP] | Japan | 5-207660 |
| Aug. 23, 1993 | [JP] | Japan | 5-207661 |
| Aug. 23, 1993 | [JP] | Japan | 5-207662 |
| Aug. 23, 1993 | [JP] | Japan | 5-207663 |

[51] Int. Cl.⁶ .................................................. G01J 5/02
[52] U.S. Cl. .................................................. 250/338.3
[58] Field of Search ........................................ 250/338.3

[56] References Cited

U.S. PATENT DOCUMENTS

| | | | |
|---|---|---|---|
| 4,532,424 | 7/1985 | Cheung | 250/338.3 |
| 5,270,555 | 12/1993 | Ito et al. | 250/338.3 |
| 5,286,975 | 2/1994 | Ogura et al. | 250/338.3 |

FOREIGN PATENT DOCUMENTS

| | | |
|---|---|---|
| 32828 | 2/1984 | Japan ............... 250/338.3 |
| 60-30116 | 2/1985 | Japan . |
| 1-136035 | 5/1985 | Japan . |
| 61-38432 | 2/1986 | Japan . |
| 61-38427 | 2/1986 | Japan . |
| 62-821 | 1/1987 | Japan . |
| 1136035 | 5/1989 | Japan ............... 250/338.3 |
| WO82/01066 | 4/1982 | WIPO . |
| WO91/16607 | 10/1991 | WIPO . |

OTHER PUBLICATIONS

Takayama et al., "Pyroelectric Infrared Array Sensors Made of c–Axis–oriented La–modified $PbTiO_3$ Thin Films", Sensors and Actuators—A Physical, vol. A22, No. 1/3, Mar. 1990, pp. 508–512.

Primary Examiner—Carolyn E. Fields
Attorney, Agent, or Firm—Willian Brinks Hofer Gilson & Lione

[57] ABSTRACT

A pyroelectric infrared radiation detector for detecting the intensity of infrared radiation with a pyroelectric element. The pyroelectric infrared radiation detector comprises a substrate made of a single crystal material and an infrared radiation detecting structure which comprises a first electrode disposed on the substrate, a pyroelectric thin film disposed on the first electrode, and a second electrode disposed on the pyroelectric thin film for absorption of infrared radiation. The substrate has a recess provided in the upper surface thereof where the infrared radiation detecting structure is seated. A method of producing the pyroelectric infrared radiation detector comprises a first step of forming a first electrode on one surface of a substrate, a second step of forming a pyroelectric thin film on the first electrode, a third step of forming a second electrode on the pyroelectric thin film, a fourth step of providing etching apertures in the first electrode which is open to the substrate, and a fifth step of providing by wet etching process a recess(es) in the surface of the substrate where the first electrode is seated.

12 Claims, 8 Drawing Sheets

PYROELECTRIC INFRARED RADIATION DETECTOR AND METHOD OF PRODUCING THE SAME

FIELD OF THE INVENTION

The present invention relates to a pyroelectric infrared radiation detector for detecting an intensity of infrared radiation with a pyroelectric element and to a method of producing the same.

BACKGROUND OF THE INVENTION

A variety of pyroelectric infrared radiation detectors which can detect an object or temperature without direct contact have been utilized for measuring the temperature of an electronic oven, controlling an air conditioner to the room temperature, activating the opening and closing of an automatic door, triggering an alarm device, and so forth. Their range of applications will surely be increased in the coming future.

The pyroelectric infrared radiation detector is a sort of sensor using the pyroelectric effect of a ferroelectric substance. The ferroelectric substance has spontaneous polarization in one direction to generate positive and negative charges at the surface. In a common state under the atmospheric pressure, it remains neutral while coupling with charges of molecules in the atmosphere. It is known that every object emits an intensity of infrared ray according to the temperature. An infrared radiation sensor upon receiving at its probe an intensity of infrared radiation from an object causes its ferroelectric substance to produce an electricity corresponding to the thermal change by the radiation. For measuring the intensity of infrared radiation at higher accuracy, it is thus needed to have an infrared radiation detecting structure of the detector increased in the thermal response. This is implemented by using a thin film of a pyroelectric material.

One of the conventional pyroelectric infrared radiation detectors will be explained.

FIGS. 9(a), 9(b), and 9(c) are a plan view, a cross sectional view, and a processing flow chart respectively of the conventional pyroelectric infrared radiation detector. As shown in FIGS. 9(a) and 9(b), there are provided a single crystal substrate of magnesium oxide 91 (referred to as (100) MgO single crystal substrate hereinafter) and two electrodes 92a and 92b. The electrode 92b serves as an infrared radiation absorbing layer. Also, a pyroelectric thin film 93 is disposed between the two electrodes 92a and 92b in layers thus constituting an infrared radiation detecting structure. Denoted by 94a and 94b are polyimide resin layers for protecting and supporting the infrared radiation detecting structure or more particularly, main parts of the electrodes 92a and 92b. The resin layer 94a acts as an interlayer insulating layer between the two electrodes 92a and 92b. There is an opening 95 provided for reducing the thermal capacity of the pyroelectric thin film 93.

A procedure of producing the aforementioned conventional pyroelectric infrared radiation detector will now be explained referring to FIG. 9(c). The procedure starts with developing a layer of the pyroelectric thin film 93 on the (100) MgO single crystal substrate 91 by high-frequency magnetron sputtering of a material of titanate including lanthanum (referred to as PLT hereinafter) with metal masking.

Then, an interlayer insulating layer of the polyimid resin 94a is formed to about 1 μm on the thin film and substrate. Using the magnetron sputtering technique, a 20-nm-thickness of nickel-chrome alloy (referred to as NiCr hereinafter) is coated as the electrode 92b on the (100) MgO single crystal substrate 91, the interlayer insulating layer 94a, and the pyroelectric thin film 93. The electrode 92b is finished when having been shaped to a predetermined pattern by photolithographic process. A layer of the polyimid 94b with about 3 μm thickness is placed over the previous layers.

Etching process using phosphoric acid is applied through a masking to the lower surface of the (100) MgO single crystal substrate 91 in order to provide the opening 95 and expose the pyroelectric thin film 93. Then, a 200-nm-thick layer of the electrode 92a is formed on the etched surface of the (100) MgO signal crystal substrate 91 by sputtering of NiCr so that it connects to the pyroelectric thin film 93.

As understood, for the purpose of increasing the thermal sensitivity of the pyroelectric infrared radiation detector by improving the thermal response of the infrared radiation detecting structure, the contact area between the infrared radiation detecting structure and the (100) MgO single crystal substrate 91 has to be reduced considerably to minimize the thermal capacity of the infrared radiation detecting structure. This is achieved by providing the opening 95 partially in the (100) MgO single crystal substrate 91. However, if the opening 95 is increased in size for reduction of the thermal capacity, the pyroelectric thin film 93 and the polyimid layers 94a and 94b in the infrared radiation detecting structure tend to cause their inner distortion stresses to generate physical disconnection or breakage, thus decreasing the operational reliability. Also, the etching for making the opening 95 extending from lowermost to uppermost of the (100) MgO single crystal substrate 91 takes a considerable length of time lowering the productivity. In addition, the shape of the opening 95 is very likely oversized causing the size of the infrared radiation detector to increase.

Particularly, due to linear and/or two-dimensional arrangement of a multiplicity of the infrared radiation detectors, the polyimid resin layers often produce thermal crosstalk thereacross degrading the thermal response.

SUMMARY OF THE INVENTION

It is an object of the present invention to provide a pyroelectric infrared radiation detector of which infrared radiation detecting structure is improved in the thermal response by minimizing the contact area between the infrared radiation detecting structure and a substrate to reduce the thermal capacity while being free from distortion, disconnection, and breakage in a pyroelectric thin film which are caused by inner stresses of the pyroelectric thin film and polyimide resin layers of the infrared radiation detecting structure. Accordingly, the operational reliability of the pyroelectric thin film will be increased.

It is another object of the present invention to provide a method of producing a pyroelectric infrared radiation detector which is improved in the thermal response of a pyroelectric thin film by eliminating thermal cross-talk via a polyimide resin material between any two adjacent detectors aligned in a linear and/or two-dimensional arrangement and also, minimized in the size and thickness of an infrared radiation detecting structure, so that the procedure of the method is rendered ease.

A pyroelectric infrared radiation detector according to the present invention comprises a substrate made of at least a single crystal material and an infrared radiation detecting structure which comprises a first electrode disposed on the substrate, a pyroelectric thin film disposed on the first electrode, and a second electrode disposed on the pyroelectric thin film for absorption of infrared radiation. The substrate has a recess provided in the upper surface thereof where the infrared radiation detecting structure is seated.

A method of producing the pyroelectric infrared radiation detector of the present invention comprises a first step of forming a first electrode on one surface of a substrate made of at least a single crystal material, a second step of forming on the first electrode a pyroelectric thin film having a crystal orientation, a third step of forming on the pyroelectric thin film a second electrode for absorption of infrared radiation, a fourth step of providing etching apertures in the first electrode which are open to the substrate, and a fifth step of providing by wet etching process through the etching apertures a recess(es) in the surface of the substrate where the first electrode is seated.

The action of the present invention will substantially be explained.

Since the recess in the surface of the substrate is located beneath the pyroelectric thin film, the thermal capacity of the infrared radiation detecting structure is equivalent to a sum of thermal capacities of the first electrode, pyroelectric thin film, and second electrode. Accordingly, the thermal capacity of the infrared radiation detecting structure can be reduced effectively, as compared with a conventional infrared radiation detecting structure which has to be exposed to a large opening of the substrate for decreasing the thermal capacity. As the result, distortion, disconnection, and breakage in the pyroelectric thin film which result from the presence of a large opening in the substrate are minimized and thus, the thermal response of the pyroelectric thin film will be enhanced.

Also, lead portions of the infrared radiation detecting structure are utilized as connecting electrodes to an external circuit so that the pyroelectric infrared radiation detector can be connected to the circuit on the same plane. This provides ease in surface mounting of the pyroelectric infrared radiation detectors.

DESCRIPTION OF THE PREFERRED EMBODIMENTS

Preferred embodiments of the present invention will be described referring to the accompanying drawings.

First Embodiment

Figure 1A:
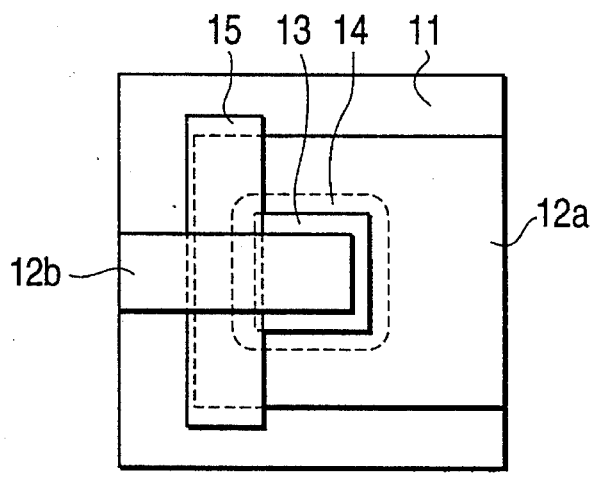
FIGS. 1(a), 1(b), and 1(c) are a plan view, a cross sectional view, and a processing flow chart respectively of a pyroelectric infrared radiation detector showing a first embodiment of the present invention.
Figure 1B:
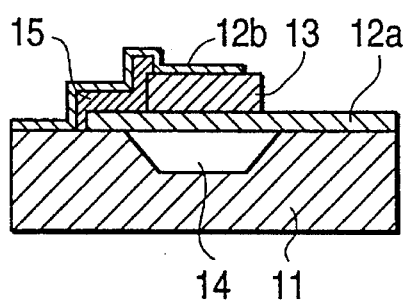
Figure 1C:
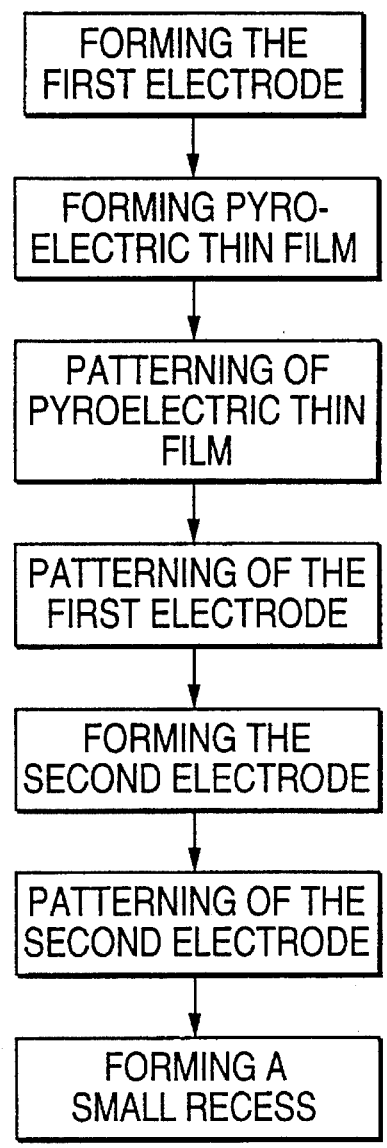

As shown in FIGS. 1(a), 1(b), and 1(c), a pyroelectric infrared radiation detector of the first embodiment of the present invention comprises a (100) MgO single crystal substrate 11 and an infrared radiation detecting structure which includes a first electrode 12a disposed on the (100) MgO single crystal substrate 11, a pyroelectric thin film 13 disposed on the first electrode 12, an interlayer insulating layer 15 disposed on the side of the pyroelectric thin film 13, and a second electrode 12b disposed on the pyroelectric thin film 13 for absorbing a radiation of infrared ray. In particular, the upper surface of the (100) MgO single crystal substrate 11 directly facing the infrared radiation detecting structure has a small recess 14 provided therein.

The procedure of producing such a pyroelectric infrared radiation detector as above depicted will now be explained referring to FIG. 1(c). The procedure starts with forming the substrate 11 of a (100) MgO single crystal material. A layer of the first electrode 12a is formed to a thickness of 150 nm over the (100) MgO single crystal substrate 11 by sputtering of platinum (referred to as Pt hereinafter) under the condition where the substrate temperature is 500° C., the incident power concentration is 0.45 w/cm$^2$, the sputtering gas ratio is Ar/O$_2$=$^2$/$_1$, and the gas pressure is 1.06 Pa.

Using high-frequency magnetron sputtering, the pyroelectric thin film 13 of a pyroelectric material which has a composition denoted below and is strictly oriented in a 001 direction is developed on the first electrode 12a under the condition where the substrate temperature is 600° C., the incident power concentration is 1.6 w/cm², the sputtering gas ratio is Ar/O₂=9/1, and the gas pressure is 1.0 Pa. During the sputtering, the crystalline lattice in the pyroelectric thin film 13 is distorted due to a difference in the thermal expansion factor between the (100) MgO single crystal substrate 11 and the pyroelectric thin film 13 causing the c axis to extend perpendicular to the upper surface of the substrate 11. As the result, a spontaneous polarization in one direction is established.

The chemical construction of the pyroelectric material used in this embodiment is expressed as:

$$(Pb_xLa_y)(Ti_zZr_w)O_3$$

where (a) $0.7 \leq x \leq 1$, $0.9 \leq x+y \leq 1$, $0.95 \leq z \leq 1$, $w=0$ (b) $x=1$, $y=0$, $0.45 \leq z \leq 1$, $z+w=1$ (c) $0.83 \leq x \leq 1$, $x+y=1$, $0.5 \leq z \leq 1$, $0.96 \leq z+w \leq 1$ Then, the pyroelectric thin film 13 is shaped to a predetermined pattern by photolithographic process and the first electrode 12a is also sized to a predetermined pattern. While a masking being placed to protect the unetched area, a wet etching process is applied to the upper surface of the (100) MgO single crystal substrate 11 to provide a small recess 14 just beneath the infrared radiation detecting structure. The recess 14 which extends 300 µm in horizontal and 80 µm in vertical may be created by etching with a solution containing less than 30% in volume of phosphoric acid at a temperature of 80° C. for 20 minutes.

According to the above procedure, the infrared radiation detecting structure of the pyroelectric infrared radiation detector of the first embodiment is not accompanied with any polyimide resin layer but supported at the Pt electrode 12a directly by the (100) MgO single crystal substrate 11. As the result, an intensity of infrared radiation absorbed by the second electrode 12b of NiCr is directly or efficiently transferred as thermal energy to the pyroelectric thin film 13. The infrared radiation detecting structure is thus increased in the thermal response contributing to the higher sensitivity of the pyroelectric infrared radiation detector. Also, since the recess 14 provided as a gap in the (100) MgO single crystal substrate 11 is small enough to allow the remaining surface of the substrate 11 to support the infrared radiation detecting structure, whereby the overall size of the detector can be decreased. The procedure of producing the detector of the first embodiment also becomes simple as compared with the conventional method thus ensuring an improvement of the operational reliability of its products.

The (100) MgO single crystal substrate 11 of the embodiment is advantageous in the respect of lattice constant matching with the (001) phase of the crystalline construction of a pyroelectric material and thus allows the pyroelectric thin film 13 to grow in the [001] direction of priority. As the crystalline development of the pyroelectric thin film 13 is oriented in one direction, the polarization goes definitely directional not depending on higher temperature or higher electric field. The (100) MgO single crystal substrate 11 may be replaced with any other crystalline phase of the MgO material, a single crystal material of aluminum, strontium titanate, or silicon, or a non-amorphous material of e.g. glass with equal success.

The interlayer electrode 12a between the (100) MgO single crystal substrate 11 and the pyroelectric thin film 13 is made of mainly Pt, allowing the pyroelectric thin film 13 to be high in the orientation and preventing substances of Mg from diffusing into the pyroelectric thin film 13. As Pt is a highly stable metal which is hardly oxided by heat during forming the pyroelectric thin film 13, the electrical connection between the electrode 12a and the pyroelectric thin film 13 is so guaranteed that an electrical signal corresponding to a change of charge amount in the pyroelectric thin film 13 can be detected with efficiency. Also, a resultant Pt diffused layer on the (100) MgO single crystal substrate 11 serves as a catalyst for MgO, increasing the speed of horizontal etching in the MgO substrate.

According to the procedure of the present invention, the etching on the MgO single crystal substrate 11 is implemented using the phosphoric acid solution for biting at a faster speed predetermined areas which are not protected by the masking. The etching is also made selectively while not affecting the first electrode 12a of the Pt material and the pyroelectric thin film 13 of the pyroelectric material. As the result, the small recess 14 in the MgO single crystal substrate will be created effectively and quickly.

Although the etching solution in the first embodiment contains less than 30% in volume of phosphoric acid and is about 80° C. in the temperature, it may be varied in the acid concentration and the temperature depending on processing requirements. The etching solution may otherwise be selected from hydrochloric acid, sulfuric acid, nitric acid, fluoric acid, and their combination.

Second Embodiment

Figure 2A:
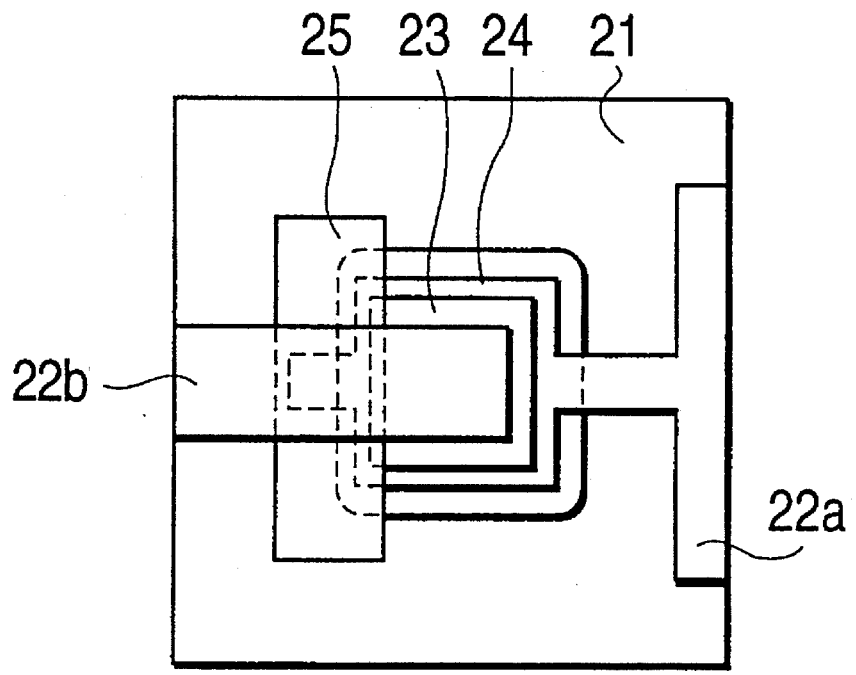
FIGS. 2(a) and 2(b) are a plan view and a cross sectional view respectively of another pyroelectric infrared radiation detector showing a second embodiment of the present invention.
Figure 2B:
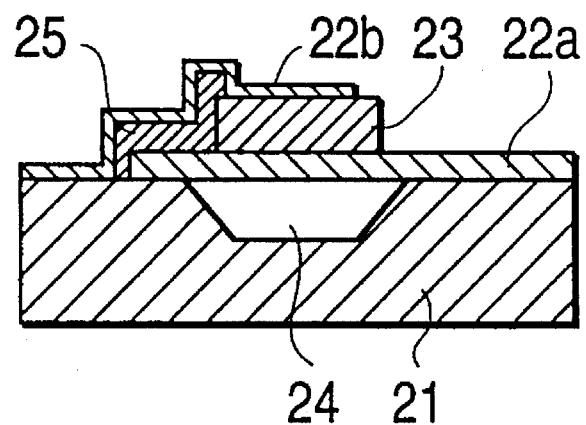

A second embodiment of the present invention will be described referring to FIGS. 2(a), 2(b), and 2(c). As shown, there are provided a substrate 21, two electrodes 22a and 22b, a pyroelectric thin film 23, a small recess 24, and an interlayer insulating layer 25. Their arrangement and the procedure of making the same are similar to those of the first embodiment. The second embodiment is differentiated from the first embodiment by the fact that the first electrode 22a allows its main portion at the infrared radiation detecting structure to be confined inside the area of the small recess 24 and at least its two lead portions to be arranged symmetrical.

According to the pyroelectric infrared radiation detector of the second embodiment of the present invention, the contact between the single crystal substrate 21 and the first electrode 22a which is high in thermal dissipation is considerably reduced in size thus minimizing the thermal leakage. Hence, the transfer of thermal energy from the first electrode 22b to the pyroelectric thin film 23 is carried out at a higher efficiency increasing the thermal response in the pyroelectric infrared radiation detecting structure of the detector.

The leads of the first electrode 22a may be arranged to a zigzag shape for absorbing any external stress to avoid disconnection.

Although the first electrode 22a in the second embodiment has two lead portions as shown, it may have a more number of leads extending radially so that the setting of the infrared radiation detecting structure is enhanced.

Third Embodiment

Figure 3A:
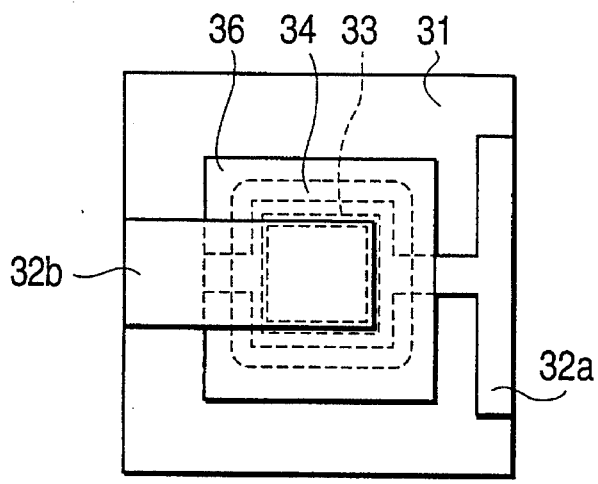
FIGS. 3(a), 3(b), and 3(c) are a plan view, a cross sectional view, and a processing flow chart respectively of a further pyroelectric infrared radiation detector showing a third embodiment of the present invention.
Figure 3B:
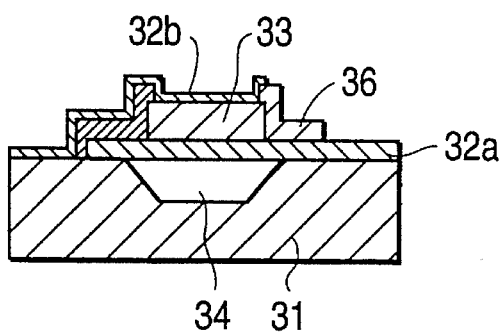
Figure 3C:
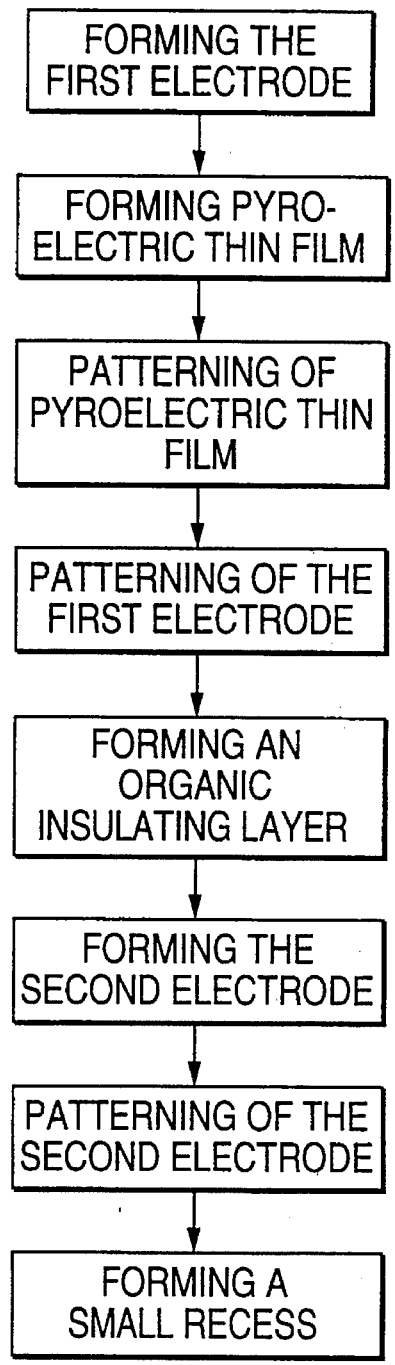

A third embodiment of the present invention will be described referring to FIGS. 3(a), 3(b), and 3(c). As shown, there are provided a substrate 31, two electrodes 32a and 32b, a pyroelectric thin film 33 and, a small recess 34. Their arrangement is similar to that of the first embodiment shown in FIG. 1. The third embodiment is differentiated from the first embodiment by the fact that the infrared radiation detecting structure is supported by an organic insulating layer 36 on the (100) MgO single substrate 31. The procedure of producing the detector of the third embodiment is also differed from the method of the first embodiment by the fact that after placing the electrode 32b of a NiCr material, the organic insulating layer 36 is built to about a thickness of 2 μm with a spinner and then, shaped to a desired pattern by a photolithographic process.

According to the pyroelectric infrared radiation detector of the third embodiment, the infrared radiation detecting structure is seated over the small recess 34 so that its thermal capacity remains not increased to give a high thermal response and a high sensitivity. The organic insulating layer 36 is capable of absorbing external stresses and also, easing an inner stress of the pyroelectric thin film 33 due to function of its organic resin material, whereby the breaking stress in the detector will be reduced. As the result, the pyroelectric infrared radiation detector will substantially be free from such a breakage as often occurs during wafer cutting process or transportation and increased in the productive efficiency and the resistance to abrupt impact.

Fourth Embodiment

A fourth embodiment of the present invention will now be described. The procedure of producing a pyroelectric infrared radiation detector of the fourth embodiment is similar to that of the first, second, or third embodiment, except that the (100) MgO single crystal substrate is processed to have an extra platinum diffused layer region created close to its upper surface. The process of creating the diffused layer region will be explained referring to FIG. 1.

The procedure starts with deposition of a Pt layer of a first electrode 12a on the (100) MgO single crystal substrate 11 at a temperature of less than 500° C. This is followed by creating the Pt diffused layer region in a close-to-surface area of the (100) MgO single crystal substrate 11. In another way, the Pt layer of the first electrode 12a may be deposited at a temperature of more than 500° C. before providing the Pt diffused layer region in the (100) MgO single crystal substrate 11. In a further manner, after deposition of the Pt layer of the first electrode 12a, the Pt diffused layer region may be provided in the (100) MgO single crystal substrate 11 by heating up to over 600° C. at a vacuum of at least $10^{-6}$ Torr in a common-use vacuum chamber or another specific vacuum chamber. In a still further manner, the Pt diffused layer region of the (100) MgO single crystal substrate 11 may be formed by depositing layers of Pt atom size on the (100) MgO single crystal layer 11 with known sputtering process and heating them up to over 600° C. at a vacuum of at least $10^{-6}$ Torr, before producing the Pt layer of the first electrode 12a.

According to the procedure of the fourth embodiment, the Pt diffused layer region of the (100) MgO single crystal substrate 11 offers ease of the etching to provide the small recess 14.

The etching may be accelerated by increasing the processing temperature to more than 500° C. during deposition of the Pt layer of the first electrode 12a.

The etching may be eased in horizontal directions when an additional heating has been applied to the MgO substrate 11 to diffuse a more amount of Pt after deposition of the first electrode 12a. This effect may also be achieved when a higher concentration of Pt is applied in the Pt diffused layer region of the (100) MgO single crystal substrate 11 by depositing layers of Pt atom size on the MgO substrate 11 before deposition of the Pt layer of the first electrode 12a and heating them to a certain temperature which is higher than the processing temperature at the forming of a pyroelectric thin film 13.

Fifth Embodiment

A fifth embodiment of the present invention will be described. The procedure of the fifth embodiment is similar to that of the first, second, or third embodiment. The fifth embodiment is differentiated from the previous embodiments, including the fourth embodiment, by the fact that the step of forming a first electrode follows a surface property change step of implanting appropriate material ions which are different from the material of the MgO substrate in a close-to-surface region of the MgO single crystal substrate.

The surface property change step is effected by ion implanting an inert gas of e.g. argon or krypton or a non-metal such as boron or nitrogen in the form of low energy ion beams to a depth of several hundreds of nanometers into a corresponding region of the (100) MgO single crystal substrate. Such an ion implanted region may be provided by exposing the upper surface of the (100) MgO single crystal substrate to a plasma atmosphere of the above material of which ions thus are doped by sputtering effect.

According to the procedure of the fifth embodiment, a lattice distortion is created inside the MgO substrate by the action of an atom which is greater in the radius. As the resultant diffusion of Pt is increased, the etching speed in horizontal directions in the (100) MgO single crystal substrate will accelerate.

Sixth Embodiment

Figure 4A:
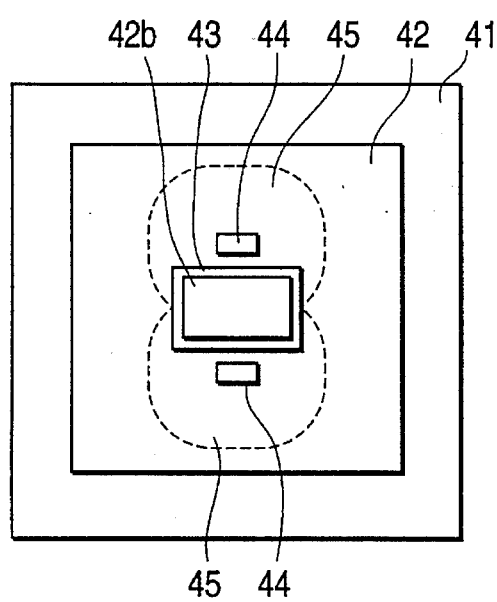
FIGS. 4(a) and 4(b) are a plan view and a cross sectional view respectively of a still further pyroelectric infrared radiation detector showing a sixth embodiment of the present invention.
Figure 4B:
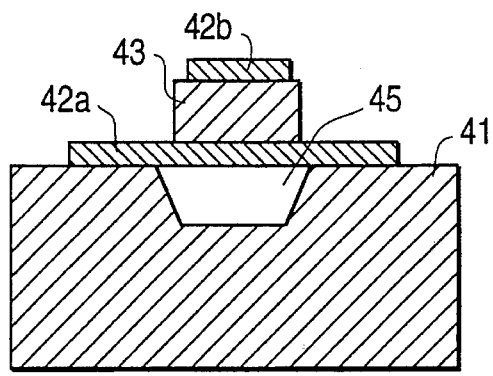

A sixth embodiment of the present invention will now be described referring to FIGS. 4(a) and 4(b). A pyroelectric infrared radiation detector of the sixth embodiment comprises a (100) MgO single crystal substrate 41 and an infrared radiation detecting structure which includes a first electrode 42a of about 200 nm in thickness made of a Pt material and disposed on the (100) MgO single crystal substrate 41, a pyroelectric thin film 43 made of a pyroelectric material such as PLT and disposed on the first electrode 42a, and a second electrode 42b of about 20 nm in thickness made of a NiCr material which is relatively low in the reflectance to infrared radiation and disposed on the pyroelectric thin film 43. In particular, the first electrode 42a has two etching apertures 44 arranged therein symmetrical about the infrared radiation detecting structure for ease of etching to provide a small recess 45 in the upper surface of the (100) MgO single crystal substrate 41 beneath the infrared radiation structure.

The advantage of the pyroelectric infrared radiation detector of the sixth embodiment will be explained.

As the small recess 45 is formed by etching through the two symmetrically arranged apertures 44 of the first electrode 42a, the infrared radiation detecting structure above the small recess 45 is securely supported by the first electrode 42a with no help of a polyimid layer. As the result, an intensity of infrared radiation absorbed by the second electrode 42b of the NiCr material can readily be transferred as thermal energy to the pyroelectric thin film 43 at high efficiency thus allowing the infrared radiation structure to be increased in the thermal response and sensitivity. Also, the two etching apertures 44 interrupt the dissipation of heat across the first electrode 42a to the (100) MgO single crystal substrate 41 and simultaneously, prevent the small recess 45 beneath from holding a portion of the heat. As the small recess 45 in the 100-MgO single crystal substrate 41 is shaped to a minimum size, the infrared radiation detecting structure is successfully supported by the remaining upper surface of the substrate 41. Accordingly, the overall dimensions of the pyroelectric infrared radiation detector of the sixth embodiment will be minimized and its producing method will be eased, thus ensuring higher operational reliability.

As set forth above, the thermal capacity is reduced by minimizing the contact area between the infrared radiation detecting structure and the substrate for increase of the thermal response of the infrared radiation detecting structure, while eliminating possible distortion, disconnection, and breakage in the pyroelectric thin film which commonly appear in a conventional pyroelectric infrared radiation detector due to inner stresses in a pyroelectric thin film and a polyimide resin layer which constitute an infrared radiation detecting structure of the detector. Also, the pyroelectric thin film remains supported securely above the recess in the substrate thus maintaining the operational reliability. The infrared radiation detecting structure will hence be minimized in size and thickness and its producing method will be eased.

Seventh Embodiment

Figure 5:
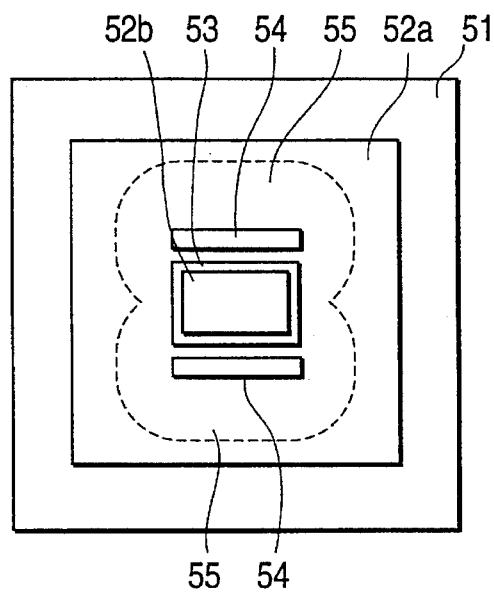
FIG. 5 is a plan view respectively of a still further pyroelectric infrared radiation detector showing a seventh embodiment of the present invention.

A seventh embodiment of the present invention will now be described referring to FIG. 5. The construction of a pyroelectric infrared radiation detector of the seventh embodiment is nearly equal to that of the sixth embodiment. More specifically, as shown in FIG. 5, it comprises a 100-MgO single crystal substrate 51 and an infrared radiation detecting structure which includes a first electrode 52a of about 200 nm in thickness made of a Pt material and disposed on the (100) MgO single crystal substrate 51, a pyroelectric thin film 53 made of a pyroelectric material such as PLT and disposed on the first electrode 52a, and a second electrode 52b of about 20 nm in thickness made of a NiCr material which is relatively low in the reflectance to infrared radiation and disposed on the pyroelectric thin film 53. Two etching slots 54 are arranged in the first electrode 52a to be symmetrical about the infrared radiation detecting structure for ease of etching, each having a length identical to that of the pyroelectric thin film 53.

The advantage of the pyroelectric infrared radiation detector of the seventh embodiment will be explained. As the two etching slots 54 are increased in length to match the pyroelectric thin film 54, the etching process through the two etching slots 54 will be carried out to a predetermined width of the recess 55 within a shorter period of time, thus increasing the productive efficiency. The two slots 54 are provided so greater in the opening size that the dissipation of heat from the infrared radiation detecting structure to the substrate can effectively be prohibited. In the case of application to a linear and/or two-dimensional arrangement of the pyroelectric infrared radiation detectors, the pyroelectric thin film 53 of each infrared radiation detecting structure is protectively disposed between the two etching slots 54 and a thermal cross-talk between any two adjacent pyroelectric infrared radiation detectors will thus be interrupted.

As set forth above, the present invention allows the thermal cross-talk between two adjacent pyroelectric infrared radiation detectors in the linear and/or two-dimensional arrangement to be avoided whereby the thermal response in the pyroelectric thin film will be increased. Also, the etching process for forming the small recess 55 will be decreased in time consumption to improve the productive efficiency.

Eighth Embodiment

Figure 6A:
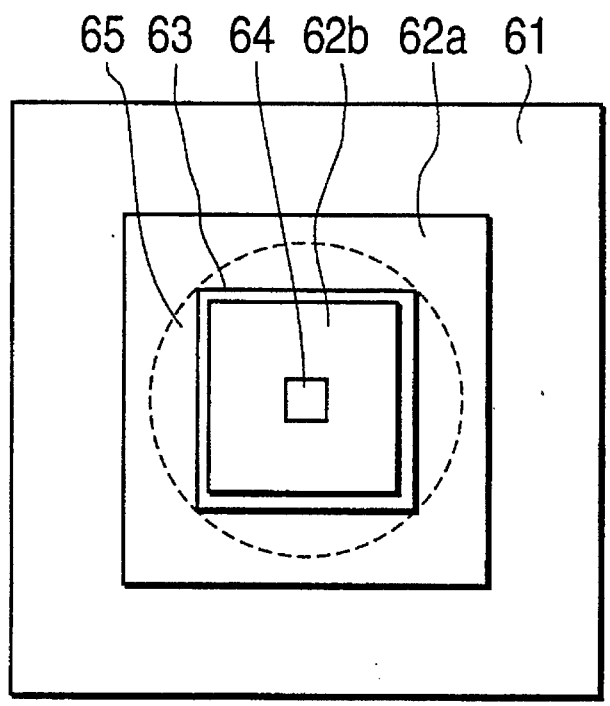
FIGS. 6(a) and 6(b) are a plan view and a cross sectional view respectively of a still further pyroelectric infrared radiation detector showing a eighth embodiment of the present invention.
Figure 6B:
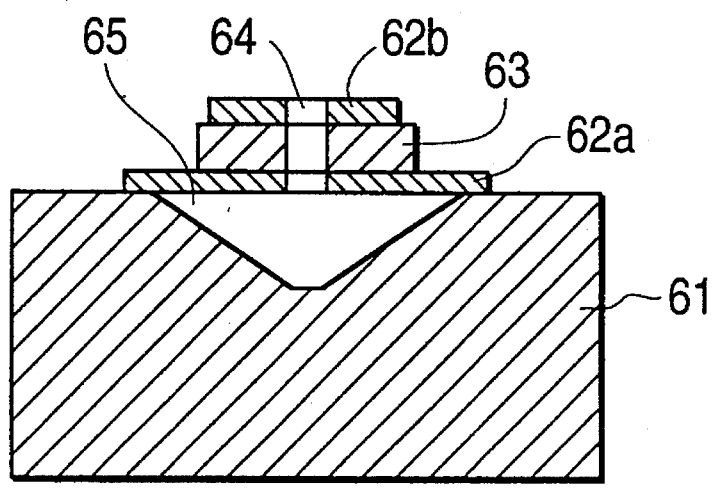

An eighth embodiment of the present invention will be described referring to FIGS. 6(a) and 6(b). As shown, a pyroelectric infrared radiation detector of the eighth embodiment comprises a (100) MgO single crystal substrate 61 and an infrared radiation detecting structure which includes a first electrode 62a disposed on the (100) MgO single crystal substrate 61, a pyroelectric thin film 63 disposed on the first electrode 62a, and a second electrode 62b disposed on the pyroelectric thin film 63. In particular, an etching aperture 64 is provided extending vertically across the infrared radiation detecting structure for ease of etching to create a small recess 65 in the upper surface of the (100) MgO single crystal substrate 61 beneath the infrared radiation structure.

According to the pyroelectric infrared radiation detector of the eighth embodiment, the etching aperture 64 extending vertically across the infrared radiation structure allows an etching liquid to pass during the etching process when the etching liquid is a solution containing 10% in volume of phosphoric acid and having a temperature of 80° C. and is applied for 20 minutes, the resultant recess 65 in the substrate 61 extends 300 μm in horizontal and 80 μm in vertical.

As the small recess 65 is formed by etching through the vertically extending aperture 64 of the infrared radiation detecting structure, the infrared radiation detecting structure above the small recess 65 is securely supported by the first electrode 62a with no help of a polyimide layer. As the result, an intensity of infrared radiation absorbed by the second electrode 62b of an NiCr material can readily be transferred as thermal energy to the pyroelectric thin film 63 at high efficiency thus allowing the infrared radiation structure to be increased in the thermal response and sensitivity. Also, the vertically extending etching aperture 64 located just above the small recess 65 is capable of instantly releasing a trapped heat from the small recess 65 of the substrate 61, increasing the thermal response of the infrared radiation detecting structure. As the small recess 65 in the (100) MgO single crystal substrate 61 is shaped to a minimum size corresponding to the size of the infrared radiation detecting structure, the infrared radiation detecting structure is successfully supported by the remaining upper surface of the substrate 61. Accordingly, the pyroelectric infrared radiation detector of the eighth embodiment will be solid in the construction and minimized in the overall dimensions. Consequently, its producing method will be eased ensuring higher operational reliability.

Ninth Embodiment

Figure 7A:
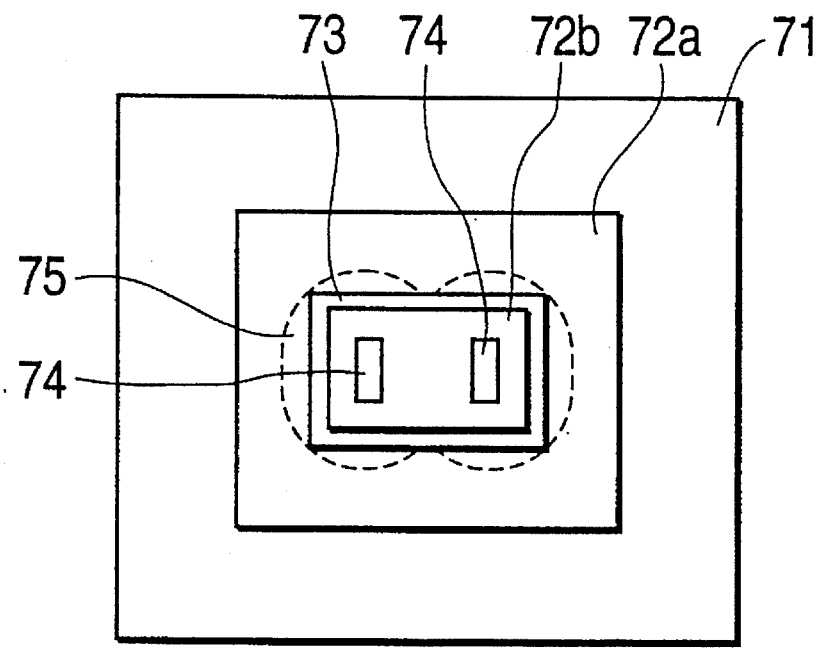
FIGS. 7(a) and 7(b) are a plan view and a cross sectional view respectively of a still further pyroelectric infrared radiation detector showing a ninth embodiment of the present invention.
Figure 7B:
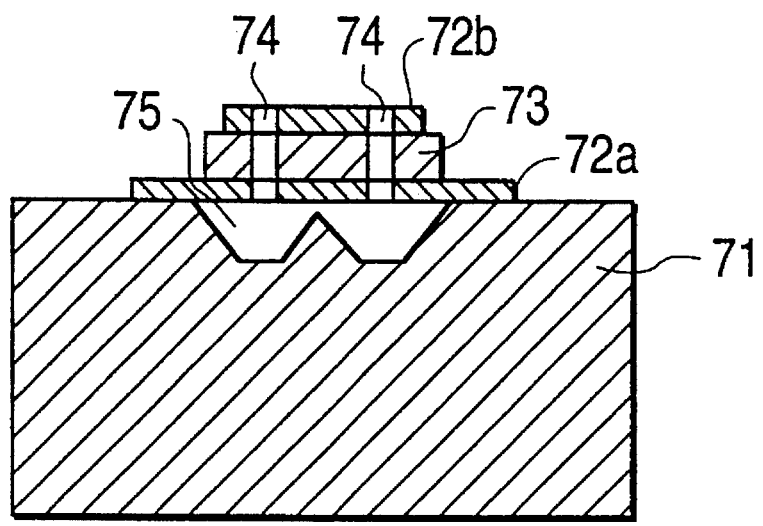

A ninth embodiment of the present invention will now be described referring to FIGS. 7(a) and 7(b). As shown, a pyroelectric infrared radiation detector of the ninth embodiment is nearly equal to that of the eighth embodiment. More specifically, it comprises a (100) MgO single crystal substrate 71, two electrodes 72a and 72b, a pyroelectric thin film 73, and a small recess 75 provided in the substrate 71. This embodiment is distinguished from the eighth embodiment by the fact that two etching apertures 74 are provided extending vertically across and symmetrical about the infrared radiation detecting structure.

Accordingly, the two symmetrically arranged etching apertures 74 extending vertically across the infrared radiation detecting structure permit etching to be carried out therethrough within a shorter period of time and also, allow the flow of an etching passes to run fast and thus be replaced with a new flow promptly. As the result, the etching process for forming the recess 75 in the substrate 71 will be decreased in time consumption increasing the productive efficiency.

Tenth Embodiment

Figure 8A:
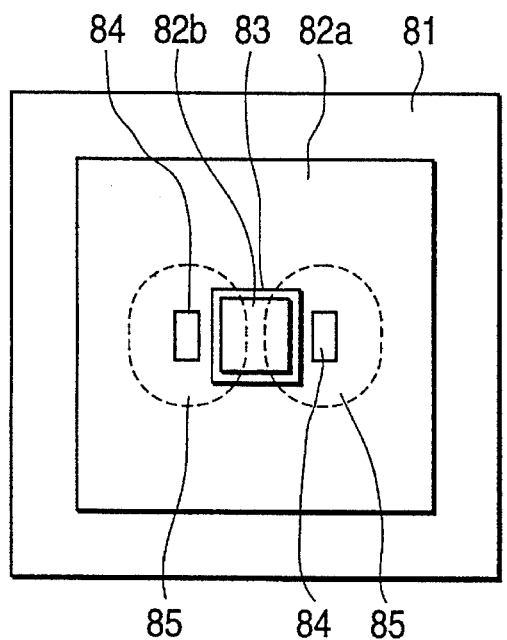
FIGS. 8(a), 8(b), and 8(c) are a plan view, a cross sectional view, and a processing flow chart respectively of a still further pyroelectric infrared radiation detector showing a tenth embodiment of the present invention.
Figure 8B:
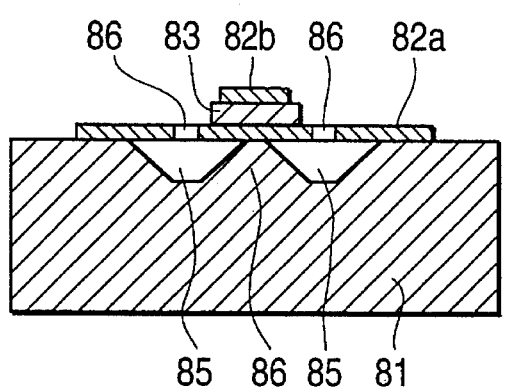
Figure 8C:
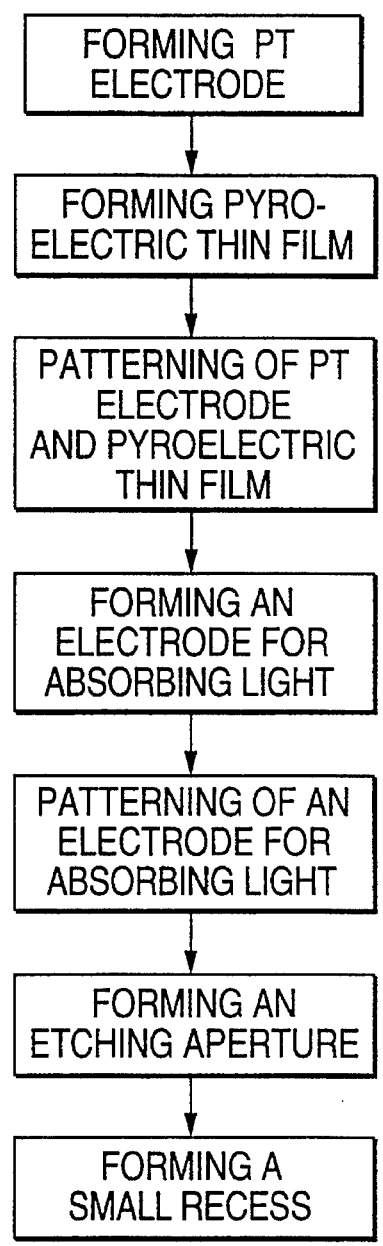
Figure 9A:
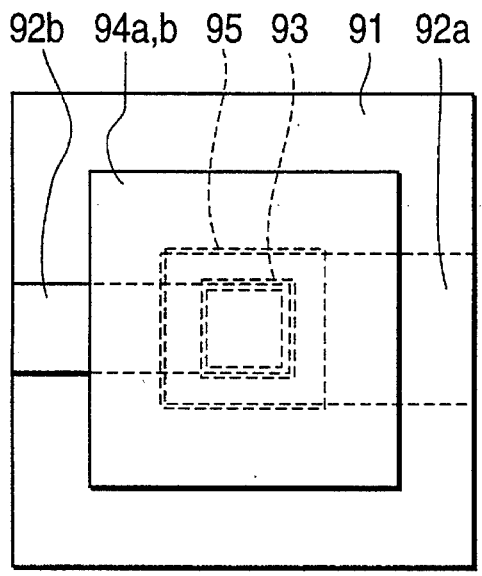
FIGS. 9(a), 9(b), and 9(c) are a plan view, a cross sectional view, and a processing flow chart respectively of a conventional pyroelectric infrared radiation detector.
Figure 9B:
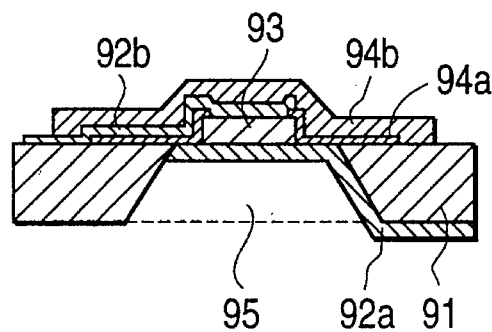
Figure 9C:
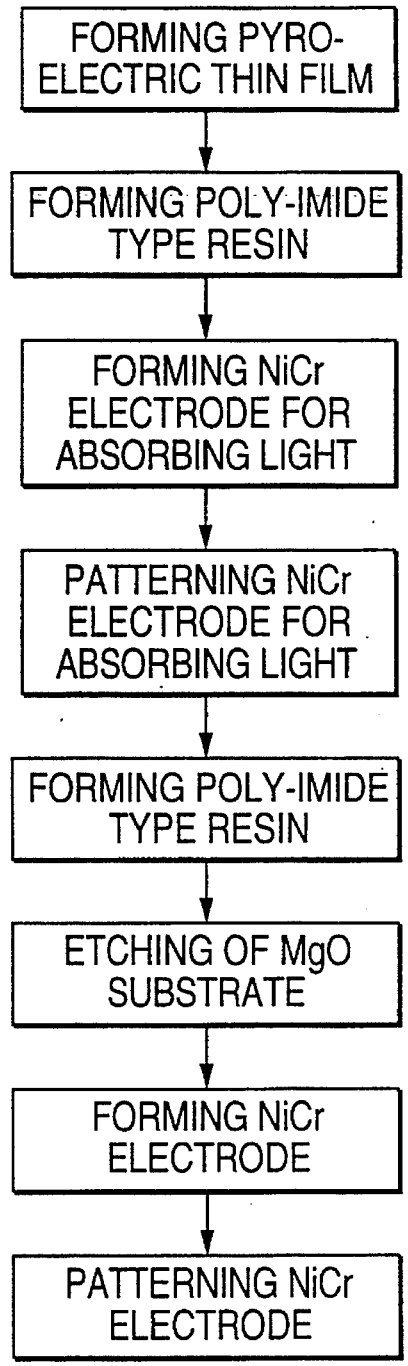

A tenth embodiment of the present invention will now be described referring to FIGS. 8(a), 8(b), and 8(c). As best shown in FIGS. 8(a) and 8(b), a pyroelectric infrared radiation detector of the tenth embodiment comprises a (100) MgO single crystal substrate 81 and an infrared radiation detecting structure which includes a first electrode 82a disposed on the (100) MgO single crystal substrate 81, a pyroelectric thin film 83 disposed on the first electrode 82a, and a second electrode 82b disposed on the pyroelectric thin film 83 for absorption of infrared radiation. In particular, the (100) MgO single crystal substrate 81 has two small recesses 85 provided in upper surface regions thereof where the infrared radiation detecting structure is directly seated. The first and second electrodes 82a, 82b and the pyroelectric thin film 83 are supported by a support surface 86 which is an intermediate portion of the (100) MgO single crystal substrate 81 between the two small recesses 85.

According to the pyroelectric infrared radiation detector of the tenth embodiment, two etching apertures 84 arranged at both sides of and flush with the pyroelectric thin film 83 are used for creating the two small recesses 85 respectively in the (100) MgO single crystal substrate 81. At the time, the intermediate portion of the substrate 81 between the two recesses 85 remains and serves as the support surface 86 supporting the infrared radiation detecting structure. When an etching liquid employed is a solution containing 10% in volume of phosphoric acid and having a temperature of 80° C. and is applied for 20 minutes, each of the resultant recesses 85 in the substrate 61 extends 300 µm in horizontal and 80 µm in vertical.

As the small recesses 85 are formed by etching through their respective apertures 84 arranged about the pyroelectric thin film 83 and the support surface 86 of the 100-MgO single crystal substrate 81 located between the two small recesses 85 support holds the infrared radiation detecting structure with no use of a polyimide resin layer. Accordingly, an intensity of infrared radiation absorbed by the second electrode 82b of an NiCr material can readily be transferred as thermal energy to the pyroelectric thin film 83 at high efficiency thus allowing the infrared radiation structure to be increased in the thermal response and sensitivity. Also, the two etching apertures 84 located just above their respective small recesses 85 are capable of effectively releasing trapped heat from the two small recesses 85 of the substrate 81, increasing the thermal response of the infrared radiation detecting structure. As the two recesses 85 in the (100) MgO single crystal substrate 81 are shaped to a minimum size corresponding to the size of the infrared radiation detecting structure, the infrared radiation detecting structure is successfully supported by the remaining upper surface of the substrate 81 including the support surface 86. A duration required for etching process in the procedure of producing the pyroelectric infrared radiation detector is controlled to have the two apertures 85 of a minimum size. As the result, the pyroelectric infrared radiation detector of the tenth embodiment will be solid in the construction and adjustable to optimum dimensions. As the etching duration is decreased, the overall procedure will be minimized.

We claim:

1. A pyroelectric infrared radiation detector comprising:
   a substrate made of a (100) magnesium oxide single crystal material;
   an infrared radiation detecting structure comprising a first electrode disposed on the substrate, a pyroelectric thin film disposed on the first electrode, and a second electrode disposed on the pyroelectric thin film for absorption of infrared radiation; and
   said substrate having a recess provided in the upper surface thereof where the infrared radiation detecting structure is seated.

2. A pyroelectric infrared radiation detector according to claim 1, further comprising an insulating layer disposed between the substrate and the first electrode.

3. A pyroelectric infrared radiation detector according to claim 2, wherein the insulating layer is made of an organic material.

4. A pyroelectric infrared radiation detector according to claim 1, wherein the contact area between the substrate and the first electrode is smaller than an area of the first electrode which intersects the opening of the recess.

5. A pyroelectric infrared radiation detector according to claim 4, wherein for rendering the contact area between the substrate and the first electrode smaller than the area of the first electrode which intersects the opening of the recess, the size of the first electrode excluding two lead portions is reduced to locate within the opening of the recess while the two lead portions being arranged in symmetrical relationship.

6. A pyroelectric infrared radiation detector according to claim 5, wherein the two lead portions of the first electrode are arranged in zigzag configuration.

7. A pyroelectric infrared radiation detector according to claim 1, wherein the main component of said first electrode is platinum.

8. A pyroelectric infrared radiation detector according to claim 7, wherein said first electrode has an aperture extending said recess.

9. A pyroelectric infrared radiation detector comprising:
- a substrate made of a (100) magnesium oxide single crystal material;
- an infrared radiation detecting structure comprising a first electrode disposed on the substrate, a pyroelectric thin film disposed on the first electrode, and a second electrode disposed on the pyroelectric thin film for absorption of infrared radiation; and
- said substrate having a recess provided in the upper surface thereof, where the infrared radiation detecting structure is seated, by etching through two or more etching apertures provided off the infrared radiation detecting structure.

10. A pyroelectric infrared radiation detector according to claim 9, wherein the etching apertures are equal in length to one corresponding side of the infrared radiation detecting structure.

11. A pyroelectric infrared radiation detector comprising:
- a substrate made of a (100) magnesium oxide single crystal material;
- an infrared radiation detecting structure comprising a first electrode disposed on the substrate, a pyroelectric thin film disposed on the first electrode, and a second electrode disposed on the pyroelectric thin film for absorption of infrared radiation; and
- said substrate having a recess provided in the upper surface thereof, where the infrared radiation detecting structure is seated, by etching through two or more etching apertures provided in the infrared radiation detecting structure.

12. A pyroelectric infrared radiation detector comprising:
- a substrate made of a (100) magnesium oxide single crystal material;
- an infrared radiation detecting structure comprising a first electrode disposed on the substrate, a pyroelectric thin film disposed on the first electrode, and a second electrode disposed on the pyroelectric thin film for absorption of infrared radiation; and
- said substrate having a recess provided in the upper surface thereof where the infrared radiation detecting structure is seated, a portion of the substrate being located in the recess as serving as a support for supporting the first and second electrodes and the pyroelectric thin film.

* * * * *